United States Patent
Lai et al.

(10) Patent No.: US 9,837,293 B2
(45) Date of Patent: Dec. 5, 2017

(54) MECHANISMS FOR CHARGING GAS INTO CASSETTE POD

(71) Applicant: Taiwan Semiconductor Manufacturing Co., Ltd, Hsin-Chu (TW)

(72) Inventors: Wei-Yu Lai, Hsinchu (TW); Hung-Wen Chen, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 202 days.

(21) Appl. No.: 14/066,933

(22) Filed: Oct. 30, 2013

(65) Prior Publication Data
US 2015/0117986 A1   Apr. 30, 2015

(51) Int. Cl.
*H01L 21/673* (2006.01)
*H01L 21/677* (2006.01)
*B65D 81/20* (2006.01)

(52) U.S. Cl.
CPC .... *H01L 21/67393* (2013.01); *B65D 81/2076* (2013.01); *H01L 21/67389* (2013.01); *H01L 21/67733* (2013.01)

(58) Field of Classification Search
CPC ......... H01L 21/67763; H01L 21/67769; H01L 21/67772; H01L 21/67778; H01L 21/67386; H01L 21/67393; H01L 21/67389; H01L 21/54; H01L 21/67379; H01L 21/67775; H01L 21/6773; H01L 21/67733; B65D 51/00; B65D 81/2076; B65D 81/2069; F26B 21/14
See application file for complete search history.

(56) References Cited

U.S. PATENT DOCUMENTS

| | | | | |
|---|---|---|---|---|
| 5,351,415 A | * | 10/1994 | Brooks | F26B 21/003 141/85 |
| 5,431,600 A | * | 7/1995 | Murata | H01L 21/67775 414/411 |
| 5,806,574 A | * | 9/1998 | Yamashita et al. | 141/63 |
| 5,988,233 A | * | 11/1999 | Fosnight | H01L 21/67393 141/63 |
| 6,123,120 A | * | 9/2000 | Yotsumoto et al. | 141/65 |
| 6,135,168 A | * | 10/2000 | Yang | H01L 21/67373 141/91 |
| 6,189,238 B1 | * | 2/2001 | Dautartas | H01L 21/67017 34/107 |

(Continued)

FOREIGN PATENT DOCUMENTS

JP  11051827 A  *  2/1999
JP  EP 1075023 A1  *  2/2001  ....... H01L 21/67369

*Primary Examiner* — Glenn Myers
(74) *Attorney, Agent, or Firm* — McClure, Qualey & Rodack, LLP

(57) ABSTRACT

Embodiments of mechanisms for charging a gas into a cassette pod are provided. A method for charging a gas into a cassette pod includes loading at least one semiconductor wafer into a housing of the cassette pod after the at least one semiconductor wafer is processed by a processing apparatus. The method also includes removing the cassette pod from the processing apparatus by a transporting apparatus to a predetermined destination. The method further includes charging a gas into an enclosure in the housing of the cassette pod from a gas supply assembly disposed on the housing.

17 Claims, 11 Drawing Sheets

(56) References Cited

U.S. PATENT DOCUMENTS

| | | |
|---|---|---|
| 6,267,123 B1 * | 7/2001 | Yoshikawa et al. ............ 134/62 |
| 6,267,158 B1 * | 7/2001 | Saga ................................ 141/94 |
| 6,302,927 B1 * | 10/2001 | Tanigawa .......... H01L 21/67393 29/25.01 |
| 8,832,960 B2 * | 9/2014 | Kim ........................ F04F 99/00 118/696 |
| 2002/0124906 A1 * | 9/2002 | Suzuki et al. .................. 141/98 |
| 2003/0221744 A1 * | 12/2003 | Hu et al. .......................... 141/59 |
| 2006/0288664 A1 * | 12/2006 | Okabe ............... H01L 21/67393 53/510 |
| 2007/0214747 A1 * | 9/2007 | Horng et al. .................... 53/432 |
| 2008/0107506 A1 * | 5/2008 | Babbs et al. .................. 414/217 |
| 2008/0156069 A1 * | 7/2008 | Murata et al. ............... 73/19.04 |
| 2008/0251077 A1 * | 10/2008 | Durtschi et al. ......... 128/204.21 |
| 2009/0159151 A1 * | 6/2009 | Wang et al. ..................... 141/98 |
| 2010/0175781 A1 * | 7/2010 | Kisakibaru ....... H01L 21/67017 141/98 |

* cited by examiner

MECHANISMS FOR CHARGING GAS INTO CASSETTE POD

BACKGROUND

In the manufacturing of a product, the product is usually processed at many work stations or processing apparatus. A transporting of partially finished products is therefore conducted in a manufacturing process.

For example, to complete the fabrication of semiconductor wafers, various steps of deposition, cleaning, ion implantation, etching and passivation steps may be carried out before the semiconductor wafers are packaged for shipment. Each of these fabrication steps may be performed in different process machines, i.e. a chemical vapor deposition tool, an ion implantation tool, an etcher, etc. Therefore, the semiconductor wafers that are partially processed are transported between various work stations many times before the fabrication process is completed.

In some systems, cassette pods are used to store batches of the semiconductor wafers. To conduct the transporting of the semiconductor wafers, the semiconductor wafers are moved into the cassette pods, and the cassette pods and the semiconductor wafers are transported together by a handling and transport equipment. Operation of the handling and transport equipment may be conducted under automatic control using a programmed computer which issues control signals for operating the equipment with little or no intervention by an operator. Therefore the handling and transport equipment transports the cassette pods and the semiconductor wafers between two positions for different purposes.

Consequently, a safe transporting of the semiconductor wafers in a semiconductor fabrication system is desired.

BRIEF DESCRIPTION OF THE DRAWINGS

For a more complete understanding of the embodiments, and the advantages thereof, reference is now made to the following descriptions taken in conjunction Hwith the accompany drawings.

DETAILED DESCRIPTION

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

FIGS. 1-6 have been simplified for the sake of clarity to better understand the embodiments of the present disclosure. Throughout the various views and illustrative embodiments, like reference numbers are used to designate like elements.

Figure 1:
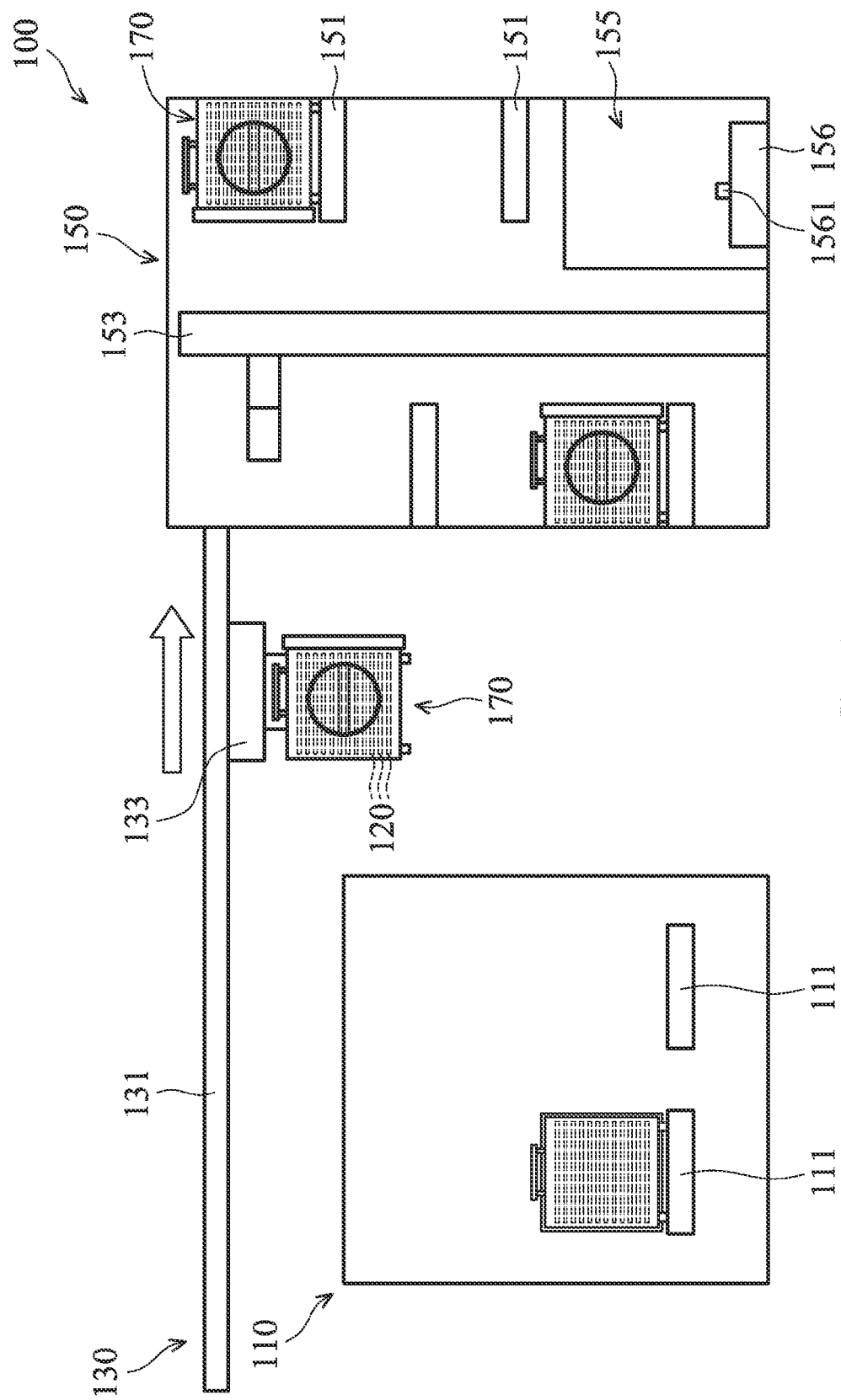
FIG. 1 shows a schematic diagram of a semiconductor fabrication system, in accordance with some embodiments.

FIG. 1 shows a schematic diagram of a semiconductor fabrication system 100 in accordance with some embodiments. The semiconductor fabrication system 100 is used in the semiconductor fabrication field. The semiconductor fabrication system 100 includes a processing apparatus 110, a transporting apparatus 130, a stocker 150, and a number of cassette pods 170. Additional features can be added to the semiconductor fabrication system 100, and some of the features described below can be replaced or eliminated in other embodiments of the semiconductor fabrication system 100.

In accordance with some embodiments, the cassette pods 170 are configured for transporting a number of semiconductor wafers, e.g., 6 wafers, 12 wafers, 24 wafers, etc. The cassette pods 170 may be as standard mechanical interfaces (SMIFs) for loading semiconductor wafers each having a diameter of 200 mm (200 mm semiconductor wafers). Alternatively the cassette pods 170 may be front opening unified pods (FOUPs), which may be used to load 300 mm or 450 mm semiconductor wafers, or semiconductor wafers with larger diameter. Other types and/or sizes of wafer carrier or pod are, however, not excluded.

Figure 2A:
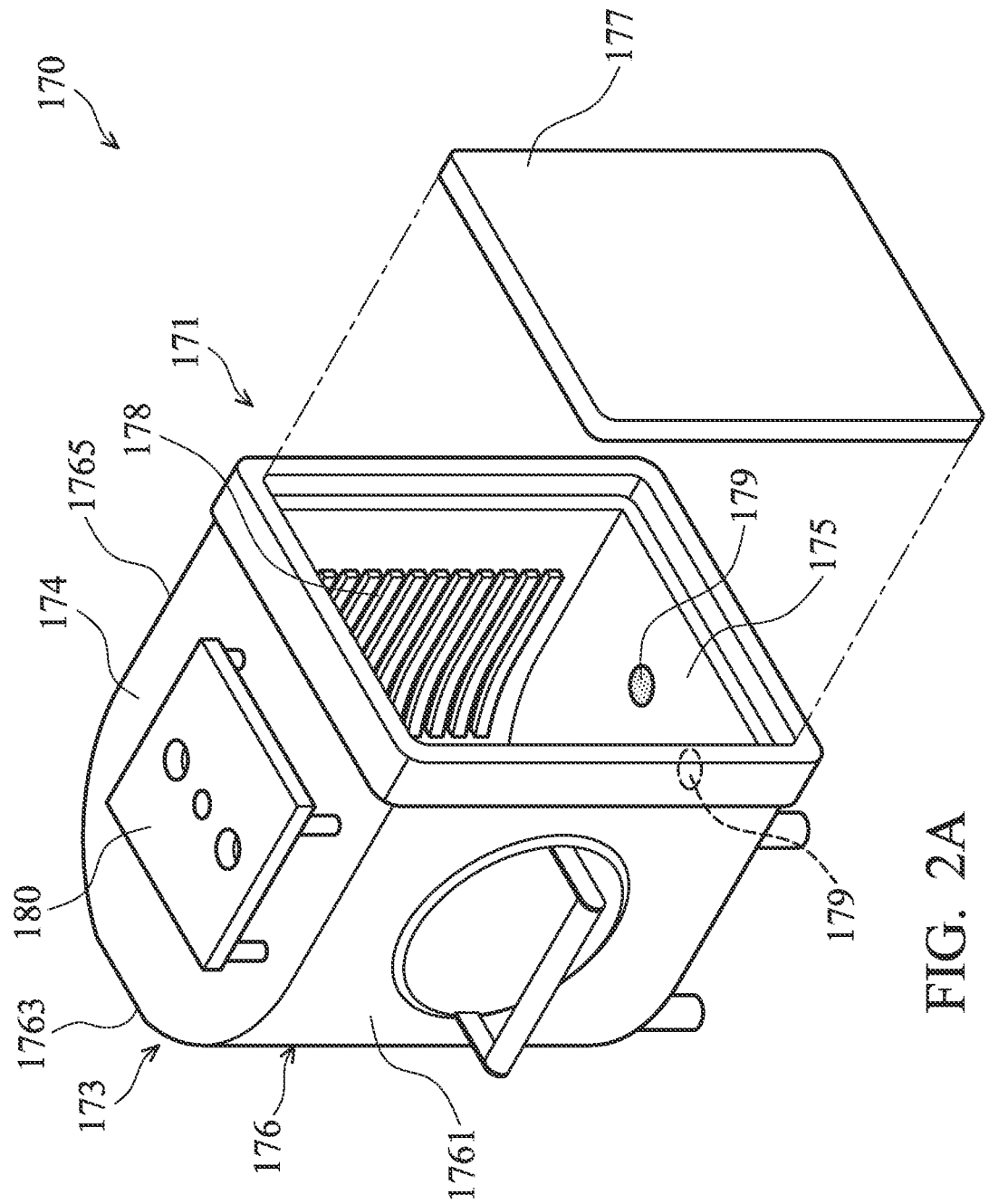
FIG. 2A shows a schematic diagram of a cassette pod, in accordance with some embodiments.
Figure 2B:
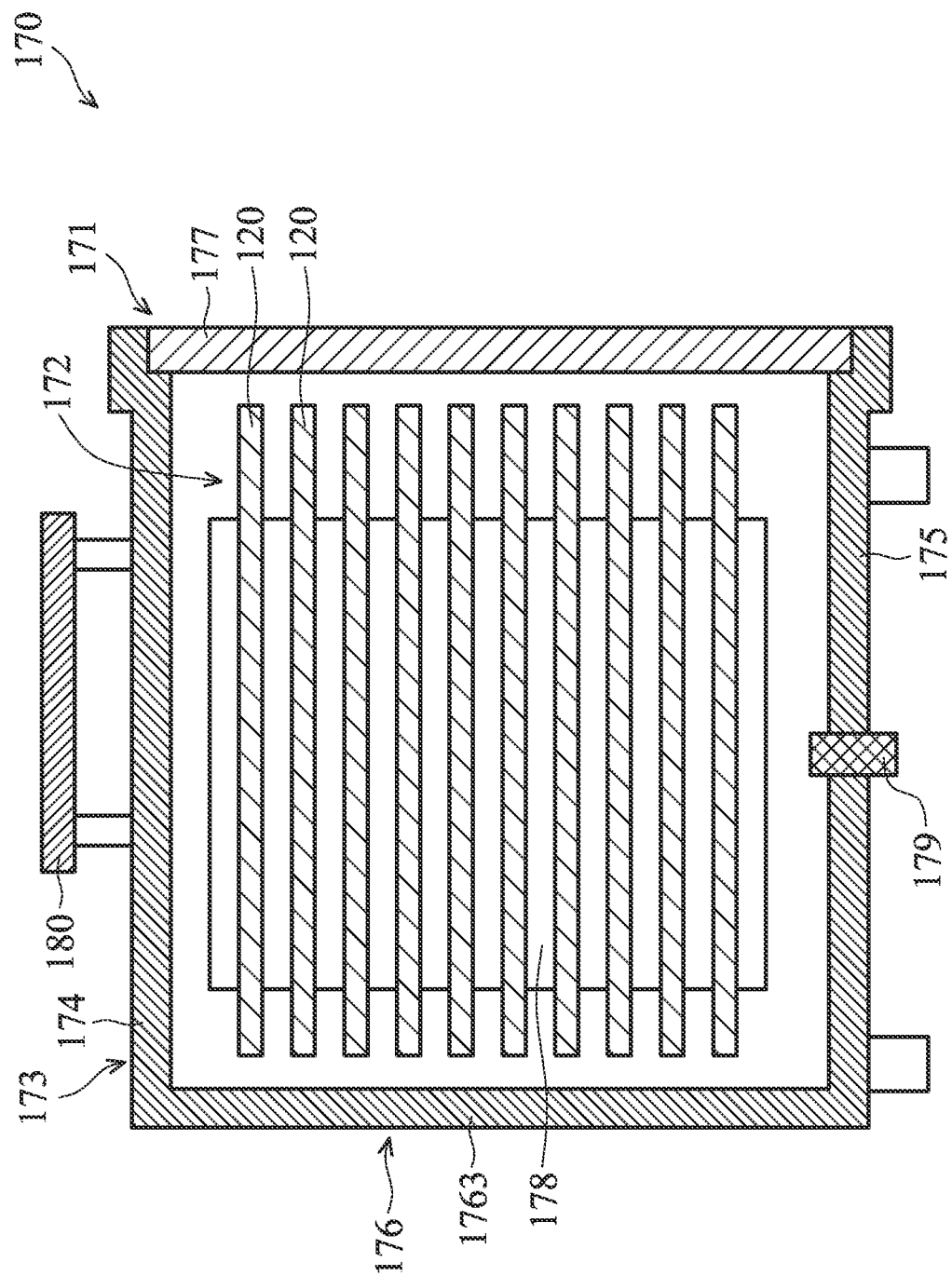
FIG. 2B shows a cross-sectional view of a cassette pod, in accordance with some embodiments.

FIG. 2A shows a schematic diagram of one of the cassette pods 170, and FIG. 2B shows a cross-sectional view of one of the cassette pods 170, in accordance with some embodiments. Each of the cassette pods 170 includes a housing 171 for containing a number of semiconductor wafers 120. The housing 171 includes a container 173 and a door 177, in accordance with some embodiments. The container 173 may be opened when the door 177 is disengaged to the container 173, as shown in FIG. 2A. Alternatively, the container 173 may be closed when the door is engaged to the container 173, as shown in FIG. 2B.

The container 173 has an upper wall 174, a lower wall 175, and a side wall unit 176. The upper wall 174 is opposite to the lower wall 175. The side wall unit 176 includes a numbers of side walls connected between the upper wall 174 and the lower wall 175. In some embodiments, the side wall unit 176 includes three side walls 1761, 1763, and 1765. The three side walls 1761, 1763, and 1765 are consecutively connected between the upper wall 174 and the lower wall 175.

The door 177 is selectively engaged with the container 173. The semiconductor wafers 120 are loaded into the enclosure 172 of the cassette pod 170 or unloaded from the enclosure 172 of the cassette pod 170 when the door 177 is disengaged from the container 173. When the door 177 is engaged to the container 173, the door 177 is held by the upper wall 174 and the lower wall 175, and the side walls 1761 and 1765, cooperatively. After the door 177 is engaged to the container 173, an enclosure 172 of the cassette pod 170 is formed inside of the housing 171.

In some embodiments, each of the cassette pods 170 further includes multiple supporting members 178 for supporting the semiconductor wafers 120. The supporting members 178 are located inside of the enclosure 172, and the supporting members 178 are fixed at the side wall unit 176 of the container 173. In some embodiments, the supporting members 178 respectively extend along a direction parallel to the upper wall 174 and the lower wall 175. Therefore, the semiconductor wafers 120 supported by the supporting members 178 is parallel to the upper wall 174 and the lower wall 175.

In some embodiments, each of the cassette pods 170 further includes a gas inlet 179 enabling a gas to be charged into the enclosure 172. In some embodiments, the gas inlet 179 is disposed on the lower wall 175, and the gas inlet 179 passes through the lower wall 175 and fluidly communicated with the enclosure 172. In some embodiments, each of the cassette pods 170 includes multiple gas inlets 179. For example, each of the cassette pods 170 includes four gas inlets 179 enabling a gas to be charged into the enclosure 172.

In some embodiments, each of the cassette pods 170 further includes a plate member 180. The plate member 180 is disposed on the upper wall 174 of the housing 171. The plate member 180 is configured for being gripped by a gripper (not shown) of the transporting apparatus 130, as shown in FIG. 1.

Referring again to FIG. 1, the stocker 150 contains a number of means for holding and moving the cassette pods 170. For example, the stocker 150 includes a number of rack portions 151 and a movement assembly 153. The cassette pods 170 are moved by the movement assembly 153 within the stocker 150 and are placed on the rack portions 151.

In some embodiments, the stocker 150 further includes a gas purging assembly 155. The cassette pods 170 are moved into the gas purging assembly 151 by the movement assembly 153 for charging a gas into the enclosures 171 of the cassette pods 170. In some embodiments, the gas purging assembly 155 includes a purge tool 156. The purge tool 156 is fluidly connected to a gas source (not shown). The purge tool 156 has one or more than one gas spreading member 1561. The number and the shape of the gas spreading member 1561 may be varied depending on the number and the shape of the gas inlet 179 of the cassette pods 170.

The transporting apparatus 130 is configured to transport or convey the cassette pods 170 to/from the stocker and/or the processing apparatus 110. The transporting apparatus 130 includes a trail assembly 131, an overhead hoist transport (OHT) assembly 133, and a transporting controller (not shown), in accordance with some embodiments. The trail assembly 131 is mounted on the ceiling of a FAB, for example. The OHT assembly 133 is suspended by the trail assembly 131, and the transportation or the movement of the OHT assembly 133 on the trail assembly 131 is controlled by the transporting controller (not shown).

The OHT assembly 133 is equipped with a gripper (not shown) that can grasp the cassette pods 170. The OHT assembly 133 transports the cassette pod 170 between the stocker 150 and the processing apparatus 110. In some embodiments, the cassette pod 170 is transferred to the processing apparatus 110 from the stocker 150 by the following operations. First, the cassette pod 170 stored in the stocker 150 is gripped by the OHT assembly 133 and transferred along the trail assembly 131 to the processing apparatus 110. When the OHT assembly 133 arrives the processing apparatus 110, the OHT assembly 133 is lowered down to the processing apparatus 110, and the cassette pod 170 is placed on a load port 111 of the processing apparatus 110. Afterwards, the OHT assembly 133 is raised up to be transported by the trail assembly 131.

In some embodiments, the cassette pod 170 is removed from the processing apparatus 110 by the following operations. First, an empty OHT assembly 133 is moved to the processing apparatus 110. Afterwards, the OHT assembly 133 is lowered down to the processing apparatus 110 to grip the cassette pod 170. Afterwards, the OHT assembly 133 with the cassette pod 170 is hoisted and transferred to the stocker 150 along the trail assembly 131.

Figure 3:
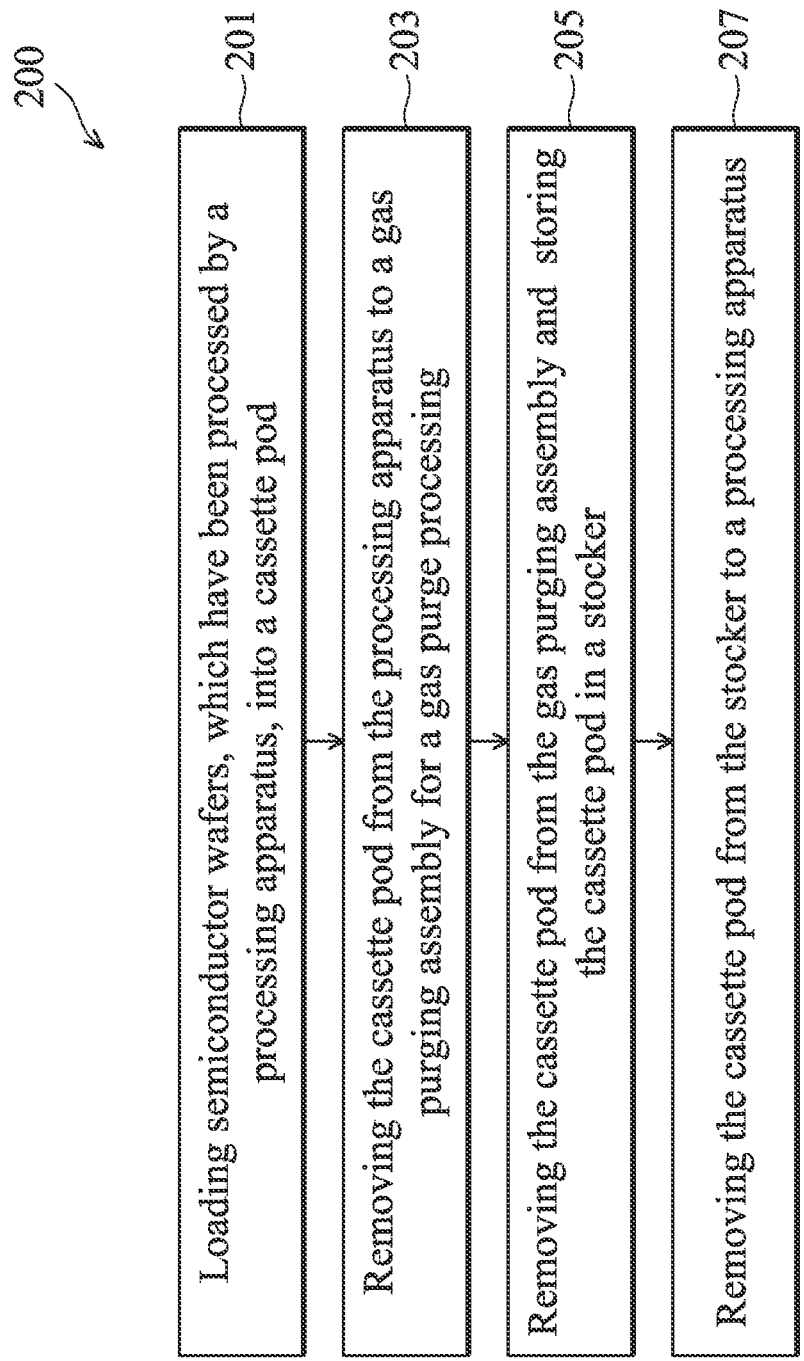
FIG. 3 is a flow chart illustrating a method for charging a gas into a cassette pod, in accordance with some embodiments.

FIG. 3 is a flow chart illustrating a method 200 for charging a gas into the cassette pod 170, in accordance with some embodiments. The method 200 begins with an operation 201 in which semiconductor wafers (such as the semiconductor wafers 120 as shown in FIG. 1), which have been processed by a processing apparatus (such as the processing apparatus 110 as shown in FIG. 1) are loaded into a cassette pod (such as the cassette pod 170 as shown in FIG. 2). After the semiconductor wafers 120 are loaded into the cassette pod 170, the cassette pod 170 is closed. Such that, the semiconductor wafers 120 disposed in the cassette pod 170 are protected from being contaminated.

The method 200 continues with an operation 203 in which the cassette pod 170 is removed from the processing apparatus 110 to a gas purging assembly (such as the gas purging assembly 155 as shown in FIG. 1) for a gas purge processing. In some embodiments, the cassette pod 170 is removed from the processing apparatus 110 by the transporting apparatus 130. Afterwards, the cassette pod 170 is transported to the gas purging assembly 155 disposed inside of the stocker 150, as shown in FIG. 1. In some embodiments, the cassette pod 170 is removed from the processing apparatus 110 to a gas purging assembly disposed outside of the stocker 150. In some embodiments, the gas charged into the cassette pod 170 is an inert gas, such as nitrogen gas or any other suitable inert gases. Nitrogen gas and/or other inert gases are used to prevent oxidation of wafers during manufacturing.

The method 200 continues with an operation 205 in which the cassette pod 170 is removed from the gas purging assembly 155 to be stored in the stocker 150. In some embodiments, the cassette pod 170 will not be moved out of the stocker 150 until another command is issued.

The method 200 continues with an operation 207 in which the cassette pod 170 is removed from the stocker 150 to a processing apparatus. In some embodiments, the cassette pod 170 is removed from the stocker 150 to a processing apparatus other than the processing apparatus 110. In some embodiments, the cassette pod 170 is removed from the stocker 150 to the processing apparatus 110 again. In some embodiments, the cassette pod 170 is removed from the stocker 150 to a stocker other than the stocker 150.

In some embodiments, for each loading of the cassette pod 170 into the stocker 150 or unloading of the cassette pod 170 from the stocker 150 takes 3-4 minutes. Also, the semiconductor fabrication system 100 is expansive, for example, 50 meters in length. Transporting the cassette pod, especially cassette pod for carrying large size wafers such as 450 mm, from a piece of the processing apparatus 110 to the stocker 150 may also take several minutes. Consequently, the operations mentioned above is time-consuming, and reduces an efficiency in manufacturing semiconductor wafer.

Figure 4:
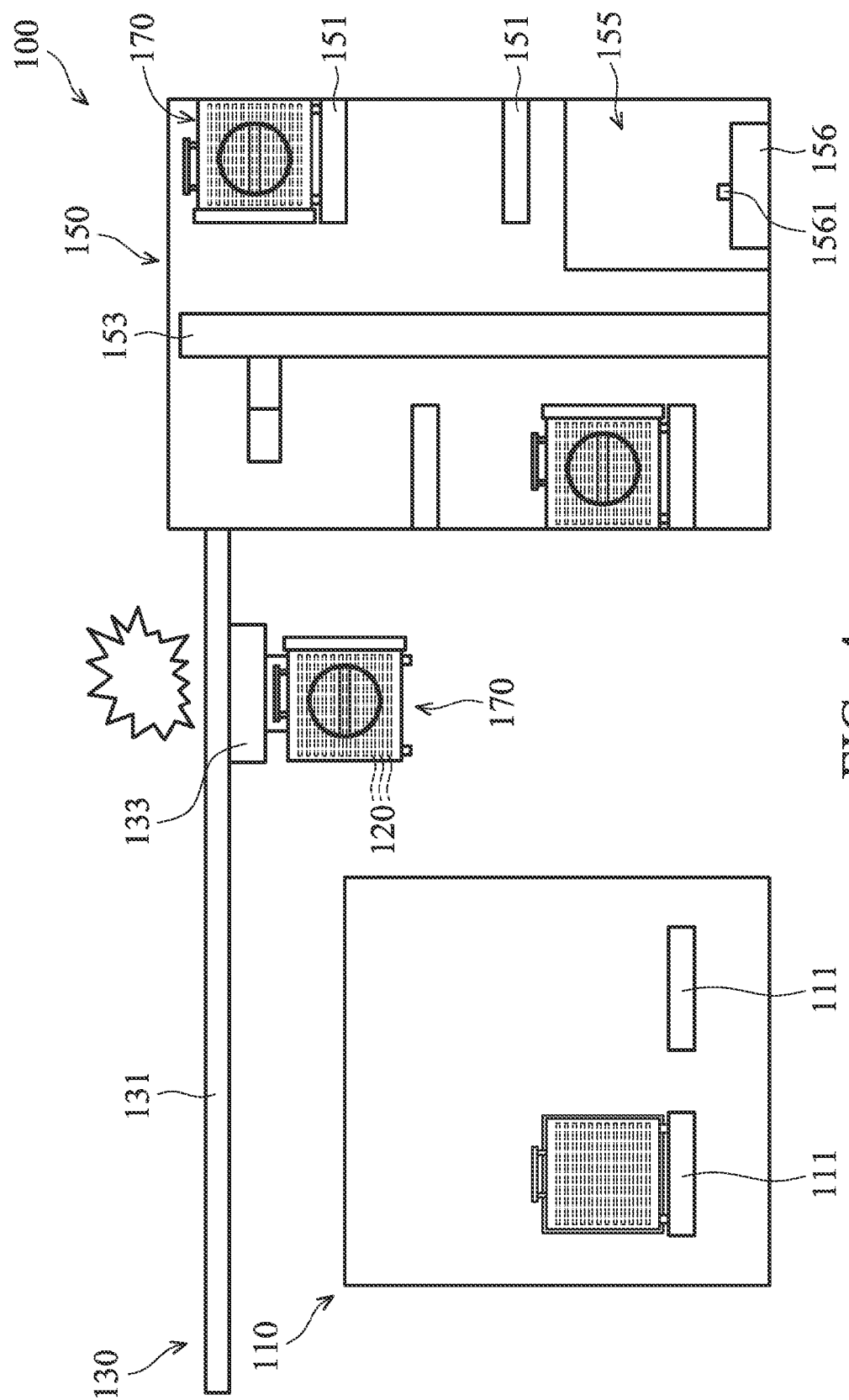
FIG. 4 shows a schematic diagram of a semiconductor fabrication system as a transportation apparatus is breakdown, in accordance with some embodiments.

Moreover, as shown in FIG. 4, in the period of transporting the cassette pod 170 from the processing apparatus 110 to the stocker 150, it is possible that the cassette pod 170 cannot be transported to the stocker 150 due to abnormal operations. For example, when a breakdown of the transporting apparatus 130 occurs, the transportation of the transporting apparatus 130 is stopped, and the cassette pod 170 cannot be transported to the stocker 150. Due to the delay of the schedule, the gas purging process cannot be executed to protect the semiconductor wafers 120 as plan. As a result, a damage of the semiconductor wafers 120 may occur.

Figure 5:
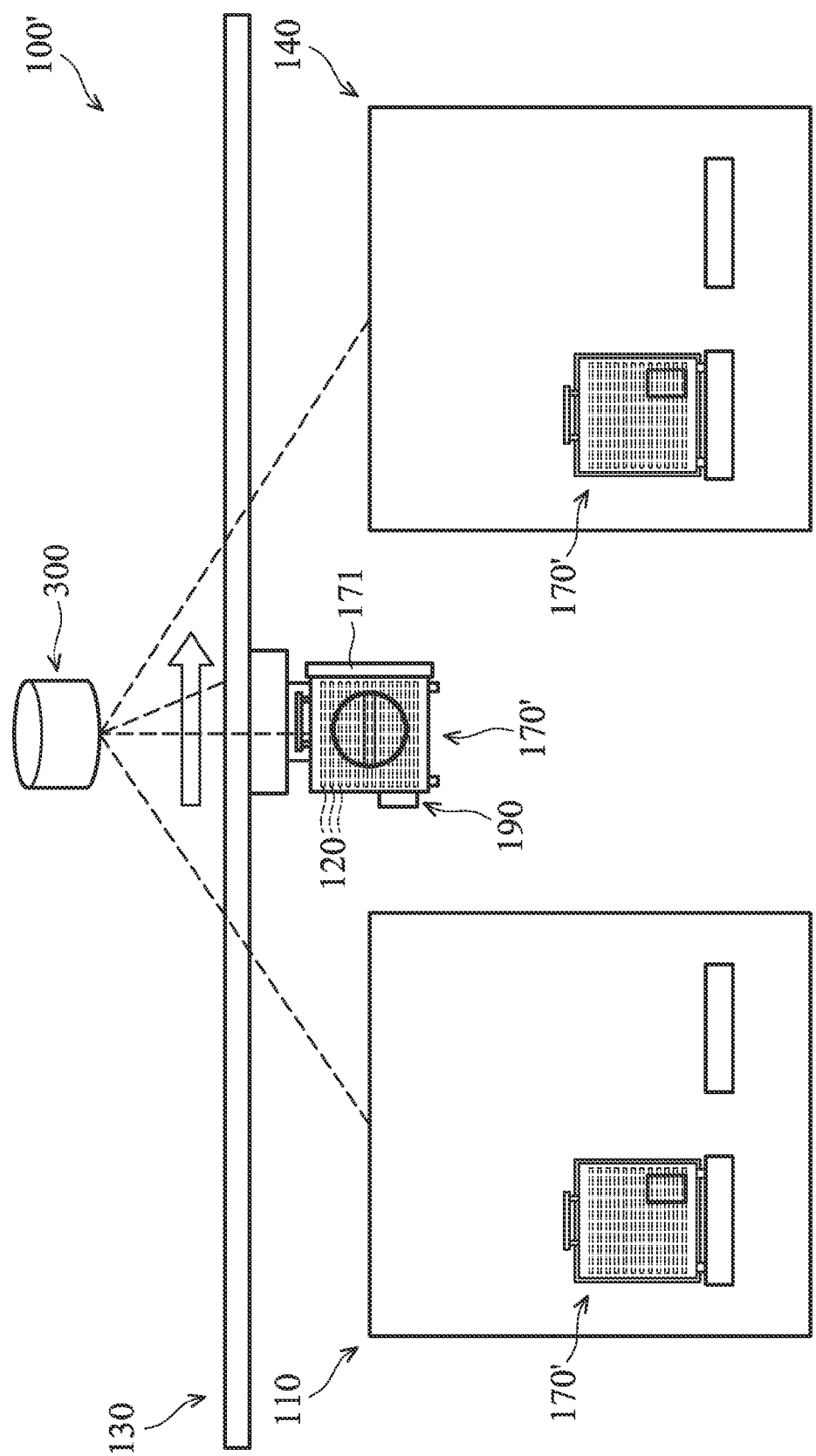
FIG. 5 shows a schematic diagram of a semiconductor fabrication system, in accordance with some embodiments.

To reduce and/or resolve the problems mentioned above, a semiconductor fabrication system 100' used in the semiconductor fabrication field is provided, in accordance with some embodiments. As shown in FIG. 5, the semiconductor fabrication system 100' includes the processing apparatus 110, the transporting apparatus 130, a processing apparatus 140, a number of cassette pods 170', and a processor apparatus 300.

In some embodiments, the processor apparatus 300 is configured for controlling operation of the processing apparatuses 110 and 140, the transporting apparatus 130, and the cassette pods 170'. In some other embodiments, the processor apparatus 300 is configured for monitoring the processing apparatus 110 and 140, the transporting apparatus 130, and the cassette pods 170'. For the purpose of illustration, the processing apparatus 110 refers to the first processing apparatus, and the processing apparatus 140 refers to the second processing apparatus in the following descriptions.

In some embodiments, the cassette pod 170' is similar to the cassette pod 170 as shown in FIG. 2B. Differences between the cassette pod 170 and the cassette pod 170' include that the cassette pod 170' further includes a gas supply assembly 190 connected to the housing 171.

Figure 6:
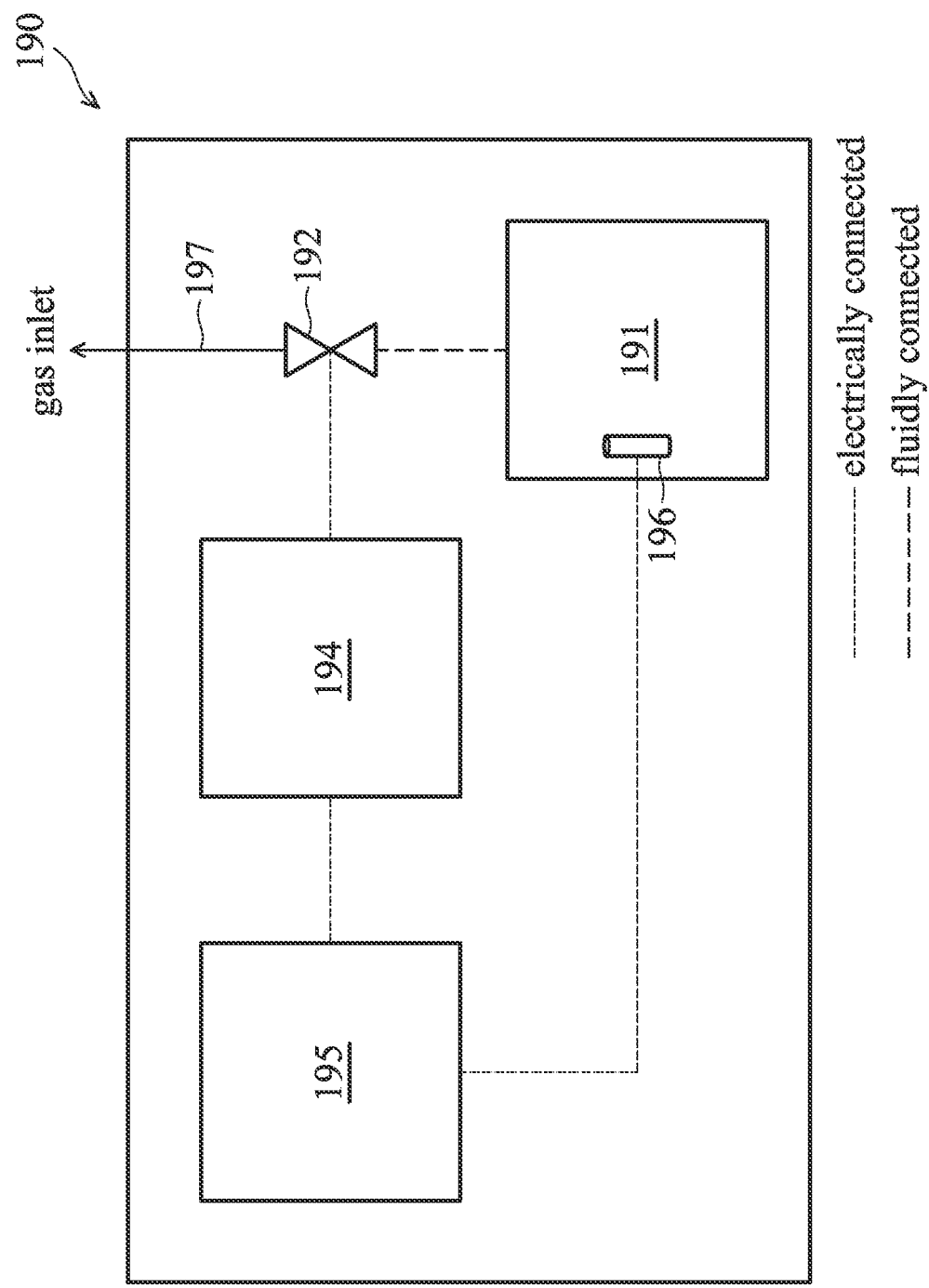
FIG. 6 shows a block diagram of the gas supply assembly, in accordance with some embodiments.

Referring to FIG. 6, a block diagram of the gas supply assembly 190 is illustrated, in accordance with some embodiments. The gas supply assembly 190 includes a cylinder 191, a flow control valve 192, a flow controller 194, a detection element 196, and a tube 197, in accordance with some embodiments.

The cylinder 191 may be made of a metal material such as iron, stainless steel, and/or aluminum. A pressurized gas is filled into the cylinder 191 in advanced. The pressurized gas may be an inert gas, such as nitrogen gas.

The flow controller 194 is electrically connected to the flow control valve 192 to actuate the flow control valve 192. The flow control valve 192, for example, is an electromagnetic valve and is fluidly connected to the cylinder 191. After receiving an actuating signal from the flow controller 194, the flow control valve 192 is switched on, and the gas is discharged from the cylinder 191. After receiving another actuating signal from the flow controller 194, the flow control valve 192 is switched off. Therefore, no gas is discharged from the cylinder 191. In some embodiments, the flow control valve 192 is a proportional electromagnetic valve. The flow rate of the gas discharged from the cylinder 191 is controlled by the flow control valve 192.

In some embodiments, the detection module 196 is configured for detecting the flow rate of the gas exhausted from the cylinder 191 (FIG. 5) and transmitting a detection signal in accordance with the detection results to the processor apparatus 300 (FIG. 5). According to the detection signals from the detection module 196, the processor apparatus 300 determines whether or not to adjust the flow rate through a control of the flow control valve 192.

In some embodiments, the detection module 196 is configured for detecting gas pressure in the cylinder 191 (FIG. 5) and transmitting a detection signal in accordance with the detection results to the processor apparatus 300 (FIG. 5). Therefore, the processor apparatus 300 is able to monitor the gas pressure in the cylinder 191 in real time.

In some embodiments, if the gas pressure in the cylinder 191 is lower than a predetermined limit, it means the gas in the cylinder is used up. Therefore, the cylinder 191 is replaced by another cylinder filled with inert gas. In some embodiments, when gas pressure in the cylinder 191 is lower than a predetermined limit, the processor apparatus 300 issues a request to transport the cassette pod 170' (including the gas supply assembly 190) to a work station (not shown), and the semiconductor wafers 120 are moved to another cassette pod 170' which is equipped with a cylinder filled with inert gas.

As shown in FIG. 6, in some embodiments, the gas supply assembly 190 further includes a wireless module 195. The gas supply assembly 190 wirelessly communicates with the processor apparatus 300 (FIG. 5) via the wireless module 195. The wireless module 195 is electrically connected to the flow controller 194 and the detection module 196. In some embodiments, the wireless module 195 includes a radio-frequency (RF) signal receiver or infrared (IR) receiver to receive radio signals. In some embodiments, the wireless module 195 includes a radio-frequency (RF) signal transmitter or infrared (IR) transmitter for transmitting radio signals.

A control signal issued by the processor apparatus 300 (FIG. 5) is transmitted to the flow controller 194 via the wireless module 195. A detection signal produced by the detection module 196 is radiated to the processor apparatus 300 via the wireless module 195. However, the gas supply assembly 190 may directly electrically connected to the processor apparatus 300 (FIG. 5) by other suitable means such as internet.

Figure 7:
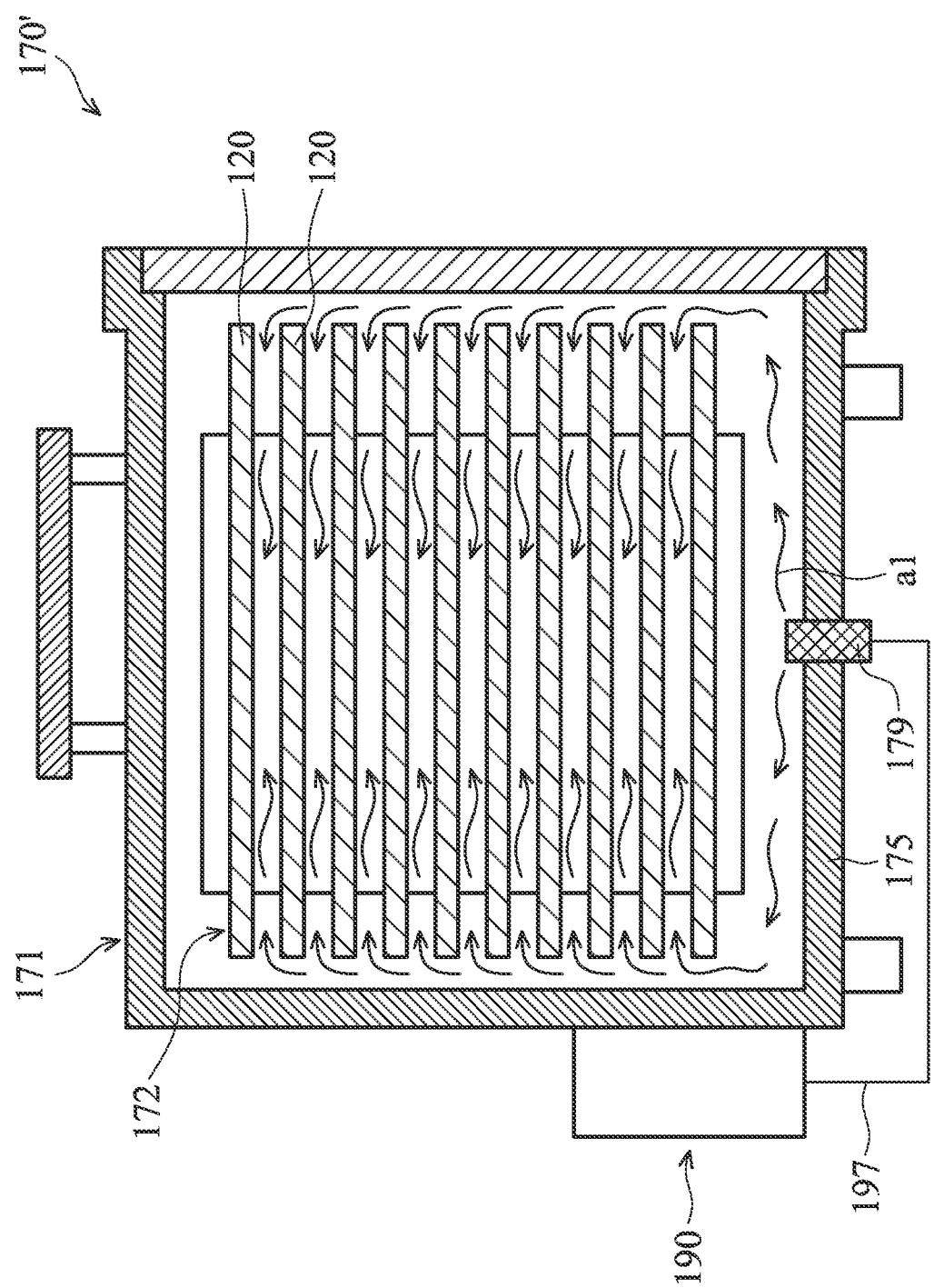
FIG. 7 shows a cross-sectional view of a cassette pod, in accordance with some embodiments.

Referring to FIG. 7, a cross-sectional view of one of the cassette pods 170' is shown, in accordance with some embodiments. The gas inlet 179 is disposed on the lower wall 175 of the housing 171. The tube 197 is fluidly connected between the flow control valve 192 and the gas inlet 179. In some embodiments, one end of the tube 197 is fluidly connected to the flow control valve 192 (FIG. 6), and the other end of the tube 197 is fluidly connected to the gas inlet 179. Therefore, the gas flow a1 from the cylinder 191 flows through the flow control valve 192, the tube 193, and the gas inlet 179 and is charged into the enclosure 172, as shown in the arrows designated with reference number a1. Therefore, the semiconductor wafers 120 are surrounded by the gas flow a1 and protected from being oxidized. However, it is appreciated that the position of the gas inlet 179 can be varied according to demands.

Figure 8:
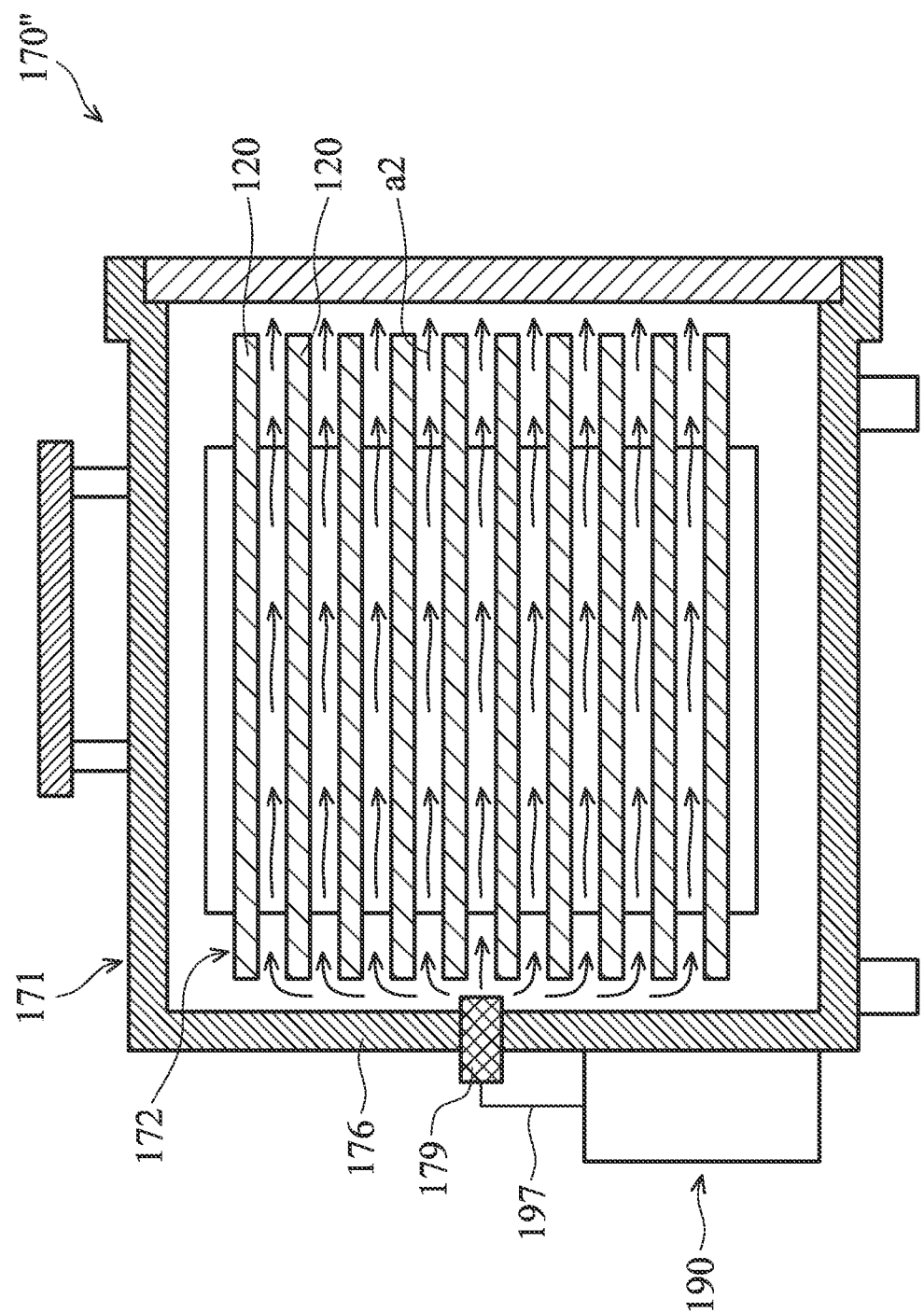
FIG. 8 shows a cross-sectional view of a cassette pod, in accordance with some embodiments.

For example, referring to FIG. 8, a cross-sectional view of one of the cassette pods 170" is shown, in accordance with some embodiments. The cassette pods 170" differs from the cassette pods 170' in that the gas inlet 179 is formed at the side wall unit 176 of the housing 171. Therefore, the gas flow a2 from the cylinder 191 flows through the flow control valve 192, the tube 193, and the gas inlet 179 and is charged into the enclosure 172 from one side of the housing 171. The gas flow a2 may be more steady and smooth as compared with the gas flow a1 in cassette pods 170', and the semiconductor wafers 120 are surrounded by the gas flow a2 and protected from being oxidized.

Figure 9:
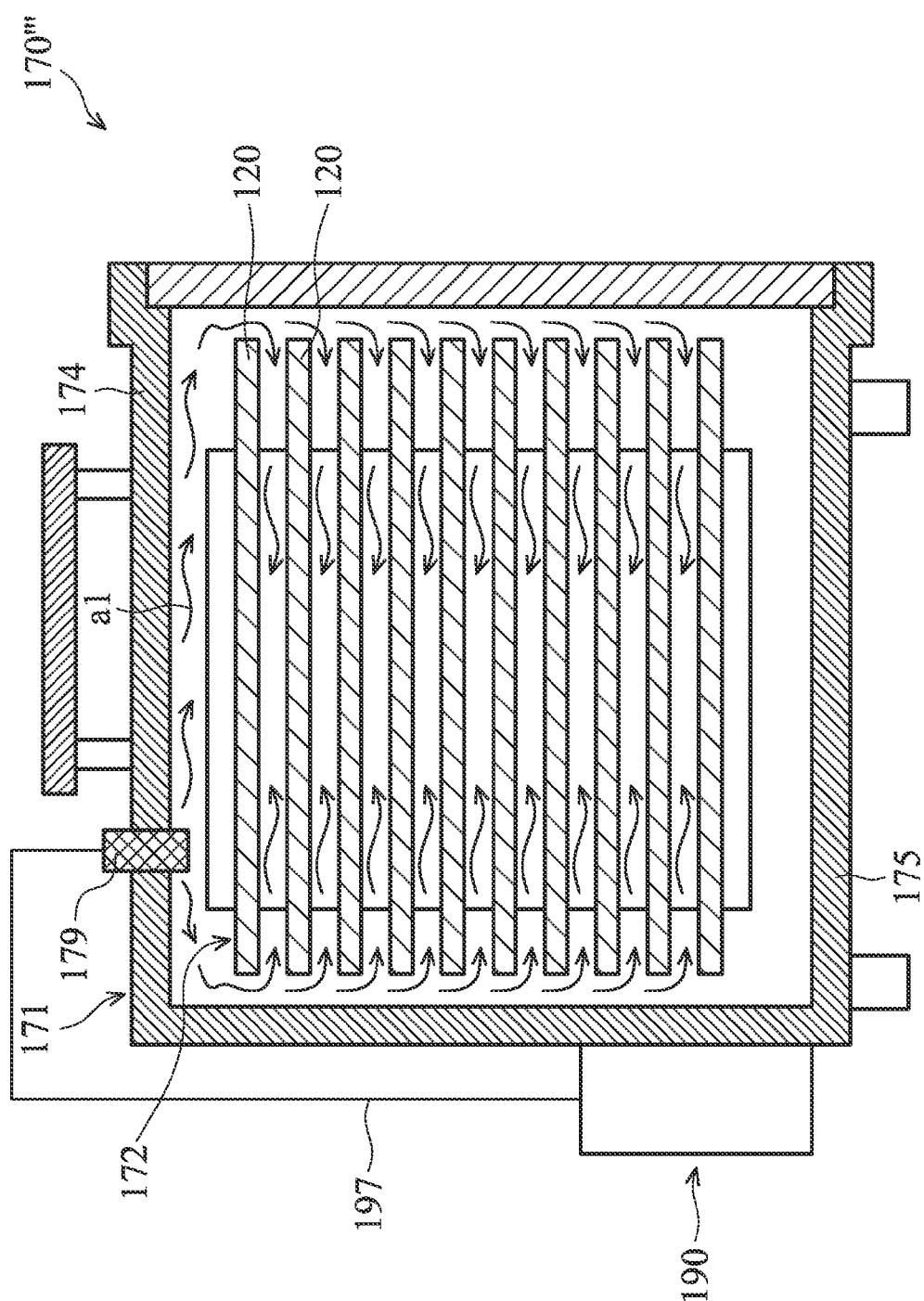
FIG. 9 shows a cross-sectional view of a cassette pod, in accordance with some embodiments.

Referring to FIG. 9, a cross-sectional view of one of the cassette pods 170''' is shown, in accordance with some embodiments. The cassette pods 170''' differs from the cassette pods 170' in that the gas inlet 179 is formed at the upper wall 174 of the housing 171. Therefore, the gas flow a3 from the cylinder 191 flows through the flow control valve 192, the tube 193, and the gas inlet 179 and is charged into the enclosure 172 from the top of the housing 171. The semiconductor wafers 120 are surrounded by the gas flow a3 and protected from being oxidized.

Figure 10:
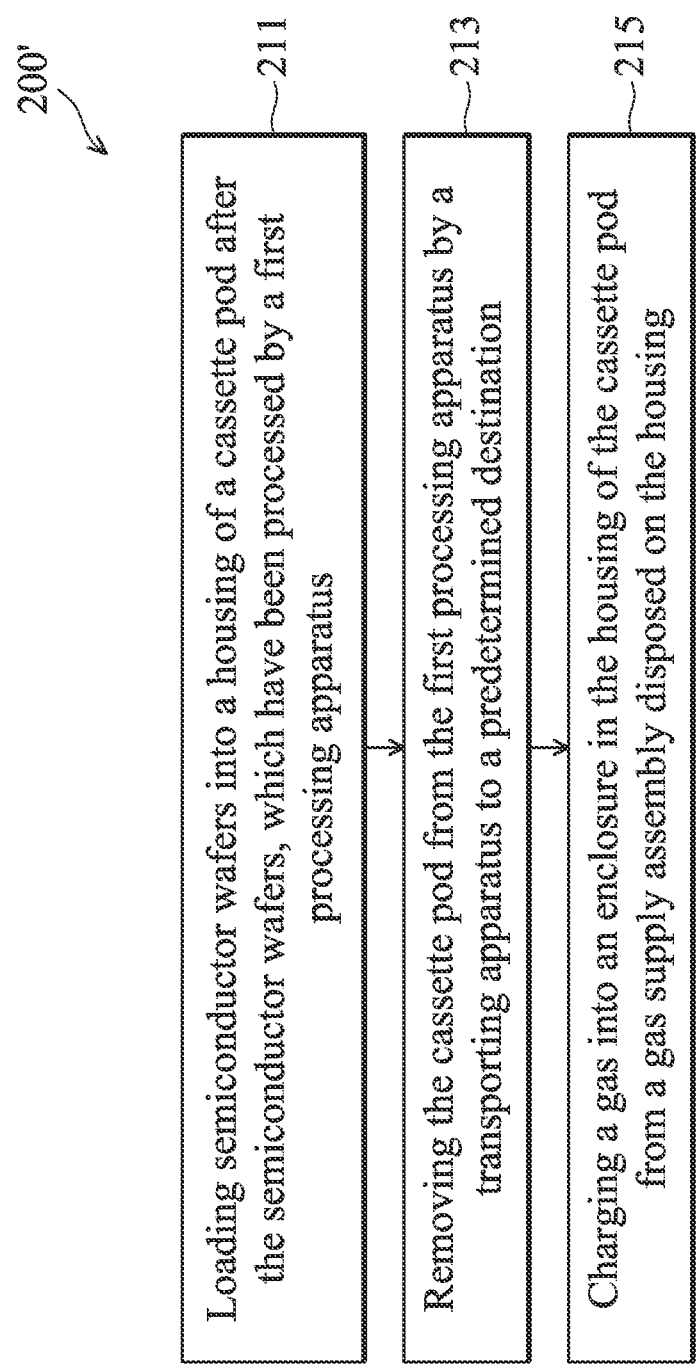
FIG. 10 is a flow chart illustrating a method for charging a gas into a cassette pod, in accordance with some embodiments.

Referring to FIG. 10, a flow chart illustrating a method 200' for charging a gas into the cassette pod 170' is shown, in accordance with some embodiments.

The method 200' begins with an operation 211 in which semiconductor wafers (such as the semiconductor wafers 120 as shown in FIG. 5) which have been processed by a processing apparatus (such as the first processing apparatus 110 as shown in FIG. 5) are loaded into a cassette pod (such as the cassette pod 170' as shown in FIG. 5). After the semiconductor wafers 120 are loaded into the cassette pod 170', the cassette pod 170' is closed. Such that, the semiconductor wafers 120, which are disposed in the cassette pod 170', are protected from being contaminated.

The method 200' also includes an operation 213 in which the cassette pod 170' is removed from the first processing apparatus 110 by the transporting apparatus 130, and the cassette pod 170' is moved to a predetermined destination. In some embodiments, the cassette pod 170' is removed from the first processing apparatus 110, and the cassette pod 170' is moved to a second processing apparatus (such as the second processing apparatus 140 as shown in FIG. 5). After the cassette pod 170' is moved to a second processing apparatus, the semiconductor wafers 120 are unloaded from the cassette pod 170' orderly, and the semiconductor wafers 120 are processed by the second processing apparatus 140. In some other embodiments, the cassette pod 170' is removed from the first processing apparatus 110 to a stocker, and the cassette pod 170' is stored in the stocker.

The method 200' further includes an operation 215 in which the enclosure 172 of the cassette pod 170' is charged with a gas from a gas supply assembly (such as the gas supply assembly 190 as shown in FIG. 5) disposed on the housing 171 of the cassette pod 170'.

In some embodiments, the operation 215 is initiated no later than the operation 213 is initiated. For example, the gas from the gas supply assembly 190 is charged into the enclosure 172 before the cassette pod 170' is transported by the transportation apparatus 130.

In some embodiments, the operation 215 is finished prior to the operation 213 is finished. For example, the operation 215 is finished before the cassette pod 170' is transported to the second processing apparatus 140. For another example, the operation 215 is finished before the cassette pod 170' is transported to the stocker (not shown).

In some embodiments, the door 177 of the cassette pod 170' (FIG. 7) is closed immediately after the operation 211 is finished, and a request is issued by the processor apparatus 300 (FIG. 5) to initiate the operation 215 simultaneously. In some other embodiments, a request is issued by the processor apparatus 300 (FIG. 5) to initiate the operation 215 before the door 177 of the cassette pod 170' (FIG. 7) is completed closed. Therefore, the semiconductor wafers 120 (FIG. 5) in the cassette pod 170' can be protected by the gas from the gas supply assembly 190 (FIG. 5) before the cassette pod 170' is transported by the transportation apparatus 130 (FIG. 5).

Embodiments of the disclosure have many advantages. For example, the operation time for charging the gas into the housing of the cassette pod is greatly reduced. Such a reduction of processing time also decreases contamination and/or oxidization risk of the semiconductor wafers during the transportation of the cassette pod.

Embodiments of mechanisms for charging a gas into a cassette pod are provided. A gas supply assembly is provided to be fluidly connected to an enclosure defined by a housing of the cassette pod. The gas can be provided by the gas supply assembly during the transportation of the cassette pod between two different locations, or two different processing apparatus, etc. Since it is not necessary to move the cassette pod into a gas purging assembly to implement a gas purging process, the operation time is greatly reduced. Manufacturing efficiency and production yield of the semiconductor wafers are greatly improved.

In accordance with some embodiments, a cassette pod for containing a semiconductor wafer is provided. The cassette pod includes a housing and a gas supply assembly. The housing defines an enclosure for containing the at least one semiconductor wafer. The gas supply assembly is connected to the housing. The gas supply assembly is configured for charging a gas into the enclosure.

In accordance with some embodiments, a semiconductor fabrication system is provided. The semiconductor fabrication system includes a cassette pod configured for containing a semiconductor wafer. The cassette pod includes a housing and a gas supply assembly. An enclosure is defined by the housing. The gas supply assembly is connected to the housing. The gas supply assembly is configured for charging a gas into the disclosure. The semiconductor fabrication system also includes a processing apparatus configured for processing the semiconductor wafer. The semiconductor fabrication system further includes a transporting apparatus configured for transporting the cassette pod.

In accordance with some embodiments, a method for operating a semiconductor fabrication system is provided. The method includes loading a semiconductor wafer into a housing of a cassette pod after the semiconductor wafer is processed by a first processing apparatus. The method also includes removing the cassette pod from the first processing apparatus by a transporting apparatus to a predetermined destination. The method further includes charging a gas into an enclosure in the housing of the cassette pod from a gas supply assembly disposed on the housing.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A cassette pod for containing at least one semiconductor wafer and adapted to be transported by a transporting apparatus, comprising:
    a housing defining an enclosure for containing the at least one semiconductor wafer and including a gas inlet, wherein the gas inlet passes through a lower fixed wall thereof and enables access to the enclosure;
    a cylinder mounted to an outer surface of a side fixed wall of the housing for retaining a gas; and
    a tube disposed outside of the housing and connecting the cylinder to the gas inlet;
    a detection element connected to the cylinder; and
    a flow control valve externally connected to the tube between the cylinder and the gas inlet for controlling the flow of the gas in the tube;
    wherein during the transportation of the cassette pod by the transporting apparatus, the cylinder, the tube, and the housing are transported together and the cylinder is configured to supply the gas into the enclosure via the tube and the gas inlet;
    wherein the detection element is configured to issues a signal to the transporting apparatus when gas pressure in the cylinder is lower than a predetermined limit.

2. The cassette pod as claimed in claim 1, wherein the housing comprises a container body having an opening and comprising the lower fixed wall and the side fixed wall; and
    a door selectively connected to the opening.

3. The cassette pod as claimed in claim 1, further comprising a flow controller electrically connected to the flow control valve to switch on and off the flow control valve.

4. The cassette pod as claimed in claim 1, wherein the gas comprises nitrogen gas.

5. The cassette pod as claimed in claim 1, further comprising a plurality of supporting members disposed in the enclosure configured for supporting the at least one semiconductor wafer.

6. The cassette pod as claimed in claim 1, wherein another cylinder is mounted to the outer surface of the side fixed wall to replace the cylinder with a gas pressure lower than a predetermined limit, and the tube is connected to the another cylinder.

7. The cassette pod as claimed in claim 1, further comprising a plate member disposed on an upper fixed wall of the housing that is opposite to the lower fixed wall where the gas inlet is located;
    wherein during the transportation of the cassette pod by the transporting apparatus, the plate member is gripped by the transporting apparatus.

8. A semiconductor fabrication system comprising:
    a cassette pod configured for containing at least one semiconductor wafer, wherein the cassette pod comprises:
    a housing defining an enclosure and including a gas inlet, wherein the gas inlet passes through a lower fixed wall thereof and enables access to the enclosure;
    a cylinder mounted to an outer surface of a side fixed wall of the housing for retaining a gas;
    a detection element connected to the cylinder;
    a tube disposed outside of the housing and connecting the cylinder to the gas inlet; and
    a flow control valve externally connected to the tube between the cylinder and the gas inlet for controlling the flow of the gas in the tube;
    a processing apparatus configured for processing the least one semiconductor wafer;
    a transporting apparatus configured for transporting the cassette pod;
    a work station containing another cylinder; and
    a processor apparatus electrically connected to the detection element and the transporting apparatus;
    wherein during the transportation of the cassette pod by the transporting apparatus, the cylinder, the tube, and the housing are transported together and the cylinder is configured to supply the gas into the enclosure via the tube and the gas inlet;
    wherein the transporting apparatus moves the cassette pod to the work station to replace the cylinder in response to a signal issued by the detection element when gas pressure in the cylinder is lower than a predetermined limit.

9. The semiconductor fabrication system as claimed in claim 8, wherein the processing apparatus is wirelessly communicated with a flow controller which is electrically connected to the flow control valve, and the flow control valve is actuated in response to a request issued by the processing apparatus.

10. The semiconductor fabrication system as claimed in claim 8, wherein another cylinder is mounted to the outer surface of the side fixed wall to replace the cylinder with a gas pressure lower than a predetermined limit, and the tube is connected to the another cylinder.

11. The semiconductor fabrication system as claimed in claim 8, further comprising a gas purging assembly for charging gas into the cassette pod, wherein the gas purging assembly comprises a gas spreading member, and the shape of the gas spreading member corresponds to the shape of the gas inlet of the cassette pod.

12. The semiconductor fabrication system as claimed in claim 11, wherein the gas purging assembly comprises more than one gas spreading member, and the housing comprises more than one gas inlet, wherein the number of the gas spreading member corresponds to the number of the gas inlets.

13. The semiconductor fabrication system as claimed in claim 8, further comprising a plate member disposed on an upper fixed wall of the housing that is opposite to the lower fixed wall where the gas inlet is located;
    wherein during the transportation of the cassette pod by the transporting apparatus, the plate member is gripped by the transporting apparatus.

14. A semiconductor fabrication system, comprising:
    a gas purging assembly comprising a gas spreading member for charging gas into a housing;
    the housing defining an enclosure for containing at least one semiconductor wafer and including a gas inlet, wherein the gas inlet passes through a lower fixed wall thereof and enables access to the enclosure, and the shape of the gas inlet corresponds to the shape of the gas spreading member;
    a cylinder mounted to an outer surface of a side fixed wall of the housing for retaining a gas;
    a detection element connected to the cylinder;
    a tube disposed outside of the housing and configured to connect the cylinder to the gas inlet;

a flow control valve externally connected to the tube between the cylinder and the gas inlet for controlling the flow of the gas in the tube;

a work station containing another cylinder; and a processor apparatus electrically connected to the detection element and the transporting apparatus;

wherein when the housing is placed on the gas purging assembly, the gas inlet is connected to the gas spreading member, and gas is discharged from the gas purging assembly into the enclosure via the gas spreading member and the gas inlet;

wherein when the housing is removed from the gas purging assembly, the cylinder is mounted to an outer surface of the side fixed wall of the housing, and the tube is disposed outside of the housing and connecting the cylinder to the gas inlet, and gas is discharged from the cylinder into the enclosure via the tube and the gas inlet;

wherein the transporting apparatus moves the housing to the work station to replace the cylinder in response to a signal issued by the detection element when gas pressure in the cylinder mounted on the housing is lower than a predetermined limit.

15. The semiconductor fabrication system as claimed in claim 14, wherein the gas purging assembly comprises more than one gas spreading member, and the housing comprises more than one gas inlet, wherein the number of the gas spreading member corresponds to the number of the gas inlets.

16. The semiconductor fabrication system as claimed in claim 14, wherein another cylinder is mounted to the outer surface of the side fixed wall to replace the cylinder with a gas pressure lower than a predetermined limit, and the tube is connected to the another cylinder.

17. The semiconductor fabrication system as claimed in claim 14, wherein when the housing is placed on the gas purging assembly, the lower fixed wall faces the gas spreading member.

* * * * *